United States Patent
Soldavini

(10) Patent No.: US 6,218,707 B1
(45) Date of Patent: Apr. 17, 2001

(54) LEAKAGE-FREE INTEGRATED ELECTRONIC SWITCH

(75) Inventor: Francesco Chrappan Soldavini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/111,310

(22) Filed: Jul. 7, 1998

(30) Foreign Application Priority Data

Jul. 23, 1997 (IT) ................................ MI97A1749

(51) Int. Cl.[7] ................................................. H01L 29/76
(52) U.S. Cl. ..................... 257/371; 257/203; 257/207; 327/333; 327/407
(58) Field of Search .................................. 257/203, 207, 257/371; 327/333, 407

(56) References Cited

U.S. PATENT DOCUMENTS 4,160,923 * 7/1979 Maeda et al. .
5,808,502 * 9/1998 Hui et al. .
5,902,121 * 5/1999 Goto .
5,914,505 * 6/1999 Hisada et al. .
5,930,191 * 7/1999 Jeon .
6,021,172 * 2/2000 Fossum et al. .

* cited by examiner

*Primary Examiner*—Stephen D. Meier
(74) *Attorney, Agent, or Firm*—Theodore E. Galanthay; Allen, Dyer, Doppelt, Milbrath & Gilchrist, P.A.

(57) ABSTRACT

An electronic switch in integrated circuit from includes a first n-channel MOS transistor and a second n-channel MOS transistor with respective source-drain paths in series between an input terminal and an output terminal, and a third n-channel MOS transistor connected between a connection node between the first and second transistors and a supply terminal. The gate electrodes of the first and second transistors are connected together to a first control terminal and the gate electrode of the third transistor is connected to a second control terminal of the electronic switch. The first and third transistors are formed in a first p-well and the second transistor is formed in a second p-well, insulated from the first. A circuit branch which is identical, but provided by p-channel MOS transistors is also provided between the input and output terminals. The electronic switch is usable in circuit applications with transient voltages which may go beyond the supply voltage of the integrated circuit in a positive or negative direction.

23 Claims, 3 Drawing Sheets

US 6,218,707 B1

LEAKAGE-FREE INTEGRATED ELECTRONIC SWITCH

FIELD OF THE INVENTION

The present invention relates to electronic devices, and, more particularly, to an integrated circuit electronic switch.

BACKGROUND OF THE INVENTION

A typical electronic switch in an integrated circuit with complementary MOS transistors (CMOS) is provided by an n-channel transistor and by a p-channel transistor each having its source and drain terminals connected, respectively, to the drain and source terminals of the other. The switch is controlled by control signals which are applied to the gate terminals of the two transistors in phase opposition to make the two transistors conductive or cut them off simultaneously.

FIG. 1 shows, in section, a portion of an integrated circuit in which an electronic switch with CMOS transistors is formed. FIG. 2 is an electrical diagram of a circuit which comprises the electronic switch of FIG. 1. In a p-type monocrystalline silicon substrate, indicated 10, there is an n-type region or n-well 11 which has, at its bottom, a buried region 12 which is strongly doped, and, hence, indicated N+. A deep contact region 13, which is also a strongly doped n-type region, extends from the surface of the substrate as far as the buried region 12. In the n-well 11, there is a p-type region or p-well 14 in which there are two strongly doped n-type regions 15, 16, which provide the source and drain regions of an n-channel transistor, and a strongly doped p-type region 17.

On top of the channel which separates the source and drain regions 15 and 16, there is a strip of electrically-conductive material (doped polysilicon or metal) 18, separated from the surface of the substrate by a layer of dielectric material, for example, silicon dioxide. The strip 18 provides the gate electrode of the n-channel transistor which is indicated M1 in the drawings.

In the n-well 11 there are also two strongly doped P+ regions, indicated 20 and 21, which provide the source and drain regions of a p-channel transistor. On top of the channel which separates the regions 20 and 21, there is a gate electrode 22, separated from the substrate by a dielectric layer as that of the n-channel transistor described above. The p-channel transistor is indicated M2 in the drawings.

Metal electrodes for the connection and biasing of the various regions are formed on the front surface of the substrate on the regions 13, 17, 16, 15, 21 and 20. An electrode is also provided on the bottom surface for biasing the substrate 30. In particular, the drain region 16 of the n-channel transistor M1 and the source region 20 of the p-channel transistor M2 are connected together to an input terminal, indicated IN, of the electronic switch. The source region 15 of the transistor M1 and the drain region 21 of the transistor M2 are connected together to an output terminal, indicated OUT, of the electronic switch. The gate electrodes 18 and 22 of the two transistors M1 and M2 provide two control terminals, indicated G1 and G2 of the electronic switch. The regions 13 and 17 are connected to respective supply terminals, indicated +Vcc and GND. The bottom surface of the substrate 10 is also connected to the supply terminal GND.

FIG. 2 shows a power MOS transistor MP with its source-drain path in series with a load Z between the terminals of a voltage supply, indicated GND and +Vcc. An electronic switch such as that of FIG. 1 is connected between the point at which the load Z is connected to the drain of the power transistor MP and a circuit S, generally indicated by its impedance towards ground, that is, towards the terminal GND. The circuit S, for example, may be a sampling circuit. The control terminals G1 and G2 are connected, respectively, to the input and to the output of an inverter INV so that a control signal $\Phi$ applied to the terminal G1 is present, inverted, as negated $\overline{\Phi}$ at the terminal G2. In this example, a positive voltage greater than the conduction threshold of the transistor M1, that is, a "high" logic signal, applied to the terminal G1, makes the n-channel transistor M1 conductive and is present as a "low" logic signal at the control terminal G2, also making the p-channel transistor M2 conductive. In these conditions, the electronic switch is closed, in the opposite conditions, it is open.

The electronic switch operates correctly, that is, it is opened by a low-level signal at the control terminal G1 and closed by a high-level signal at the same terminal, if the input voltage remains between the ground level and the level of the positive supply voltage +Vcc. It should be noted that, for correct operation of the integrated circuit, the regions 17 and 13, as well as the substrate 10, have to be biased by the connection of the terminals indicated GND and +Vcc to a power supply.

If, however, the input voltage goes beyond these levels, that is, if it becomes negative or exceeds the supply voltage +Vcc when the switch is in the open state, as occurs if the load Z is inductive, the switch is not perfectly insulated. The cause of this is to be found in the integrated structure of the electronic switch.

In fact, the regions 16, 14 and 11 together form two p-n junctions which together define a lateral npn-type bipolar transistor, indicated T1, represented by broken lines in FIG. 2. Similarly, the regions 16, 14 and 15 together define another lateral npn bipolar transistor T2, and the regions 21, 11 and 20 together define a lateral pnp bipolar transistor T3, also represented by broken lines in FIG. 2. The regions 20, 11 and the substrate 10 together define a lateral pnp bipolar transistor T4.

As can easily be confirmed, the parasitic transistors T1, T2, T3 and T4 are cut off when the input signal does not go beyond the aforementioned limits. However, the parasitic transistors become conductive if these limits are passed.

In particular, if the voltage at the terminal IN goes below the ground level, that is, if it becomes negative by an amount greater than the threshold voltage (Vbe) of the transistor T1 or of the transistor T2, that transistor becomes conductive. The conduction of T1 does not interfere with the insulation of the electronic switch because its collector current originates from the supply, but the conduction of the transistor T2 causes an injection of current from the output terminal OUT to the input terminal IN, that is, a leakage current of the switch, because the collector of T2 is connected to the output terminal OUT.

Similarly, if the voltage at the input IN exceeds the supply voltage +Vcc by an amount greater than the threshold voltage of the pnp transistors T3 and T4, these become conductive. The conduction of T4, like that of T1, does not interfere with the insulation of the electronic switch, but the conduction of T3 produces a leakage current of the switch from the input terminal IN to the output terminal OUT.

To prevent or at least attenuate the insulation leakages described above, it would be necessary to increase the distance between the regions which together form the parasitic transistors T1, T2, T3 and T4. This can be done only with regard to the transistors T1 and T4 which, however, cause only leakages towards the supply. Unfortunately, this cannot be done for the transistors T2 and T3, because this would require a modification of the characteristics of the MOS transistors M1 and M2.

SUMMARY OF THE INVENTION

An object of the present invention is to provide an electronic switch which is substantially free of insulation leakages.

This object is achieved, according to the invention, by the an electronic switch comprising a semiconductor substrate including first and second wells of a first conductivity type insulated from one another; a first terminal, a second terminal, a third terminal, a first control terminal, and a second control terminal; and a first MOS transistor, a second MOS transistor, and a third MOS transistor, all of a first type. More particularly, in the electronic switch in accordance with the invention the first MOS transistor and the second MOS transistor have respective source-drain paths connected in series between the first terminal and the second terminal defining a first connection node. The first MOS transistor and the second MOS transistor also have respective gate electrodes connected together and to the control terminal. The third MOS transistor has a source-drain path connected between the first connection node and the third terminal and a gate electrode connected to the second control terminal. Moreover, the first MOS transistor is formed in the first well and the second MOS transistor is formed in the second well.

BRIEF DESCRIPTION OF THE DRAWINGS

The invention will be understood better from the following detailed description of an embodiment thereof given with reference to the appended drawings, in which.

DETAILED DESCRIPTION OF THE PREFERRED EMBODIMENTS

Figure 1:
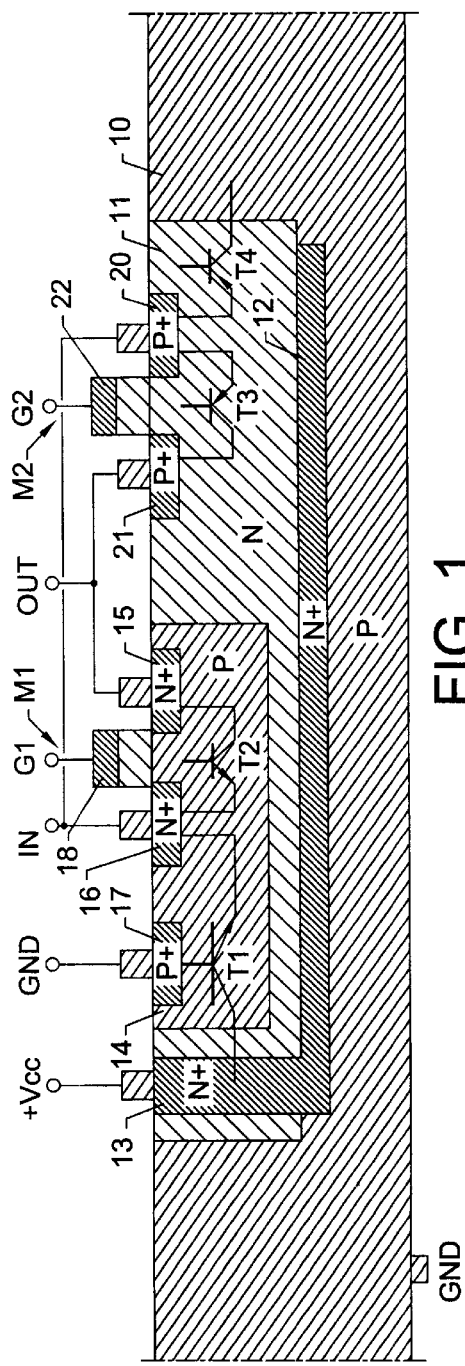
FIG. 1 is a cross-section of a portion of an integrated circuit in which a CMOS electronic switch is formed as in the prior art.
Figure 3:
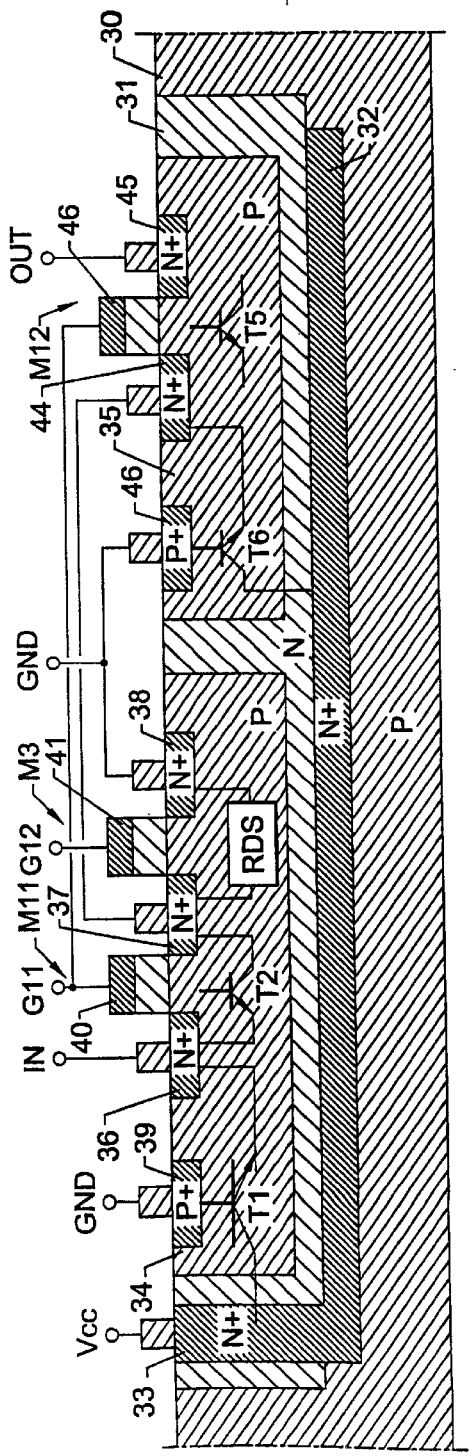
FIGS. 3 and 4 show, in cross-section, a portion of an integrated circuit which includes an electronic switch according to the invention.
Figure 4:
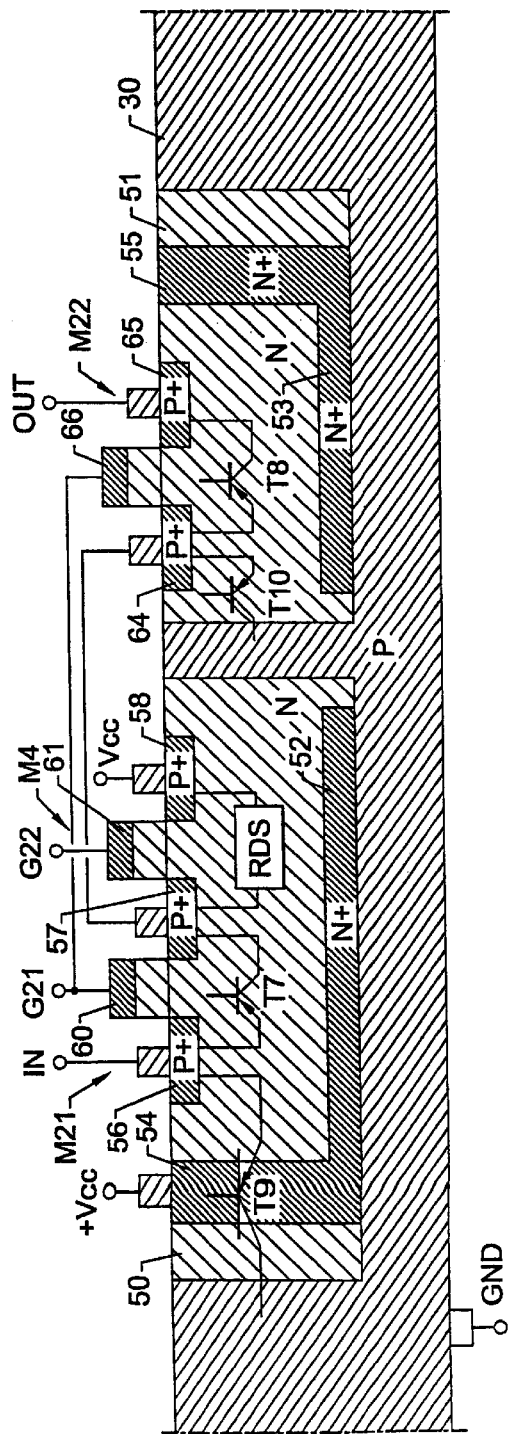

The embodiment of the invention shown in FIGS. 3 and 4 relates to an electronic switch defined, like the known circuit of FIG. 1, by two branches. FIG. 3 shows the branch of the electronic switch which replaces the branch with the n-channel MOS transistor M1 of FIG. 1 and FIG. 4 shows the branch which replaces the branch with the p-channel MOS transistor M2 of FIG. 1.

In a p-type monocrystalline silicon substrate, indicated 30, there is an n-type region or n-well 31 which has, at its bottom, a strongly doped (N+), buried n-type region 32. A deep contact region 33, which is also a strongly doped n-type region, extends from the surface of the substrate as far as the buried region 32. In the n-well 31 there are two p-type regions or p-wells, 34 and 35. In the p-well 34 there are three strongly-doped n-type regions 36, 37 and 38 and a strongly-doped p-type region 39. The regions 36, 37 and 38 provide the source and drain regions of two n-channel transistors (the region 37 which is common to the two transistors provides the source region of one transistor and the drain region of the other). On top of each of the channels which separate the source and drain regions 37, 36, and 37, 38, there is a strip of electrically-conductive material (doped polysilicon or metal) 40 or 41, separated from the surface of the substrate by a layer of dielectric material, for example, silicon dioxide. The strip 40 provides the gate electrode of an n-channel transistor which is indicated M11 in the drawings and the strip 41 provides the gate electrode of a second n-channel transistor which is indicated M3 in the drawings.

In the p-well 35 there are two strongly-doped n-type regions 44 and 45, which provide the source and drain regions of an n-channel transistor, and a strongly-doped p-type region 46. On top of the channel which separates the source and drain regions 44 and 45, there is a strip of electrically-conductive material (doped polysilicon or metal) 46 separated from the surface of the substrate by a layer of dielectric material, for example, silicon dioxide. The strip 46 provides the gate electrode of an n-channel transistor which is indicated M12 in the drawings.

Metal electrodes for the connection and biasing of the various regions are formed on the surface of the substrate, on the regions 33, 39, 36, 37, 38, 46, 44 and 45. In particular, the drain region 36 of the n-channel transistor M11 is connected to an input terminal, indicated IN, of the electronic switch. The source region 45 of the transistor M12 is connected to an output terminal, indicated OUT, of the electronic switch. The region 37 which provides both the source region of the transistor M11 and the drain region of the transistor M3 is connected to the drain region 44 of the transistor M12. The source region 38 of the transistor M3 and the strongly-doped p-type regions 39 and 46 are connected to a supply terminal, indicated GND. The n-type region 33 is connected to another supply terminal, indicated +Vcc. The gate electrodes 40 and 46 of the two transistors M11, M12 are connected together to a control terminal G11 of the electronic switch. The gate electrode 41 of the transistor M3 is connected to another control terminal G12 of the electronic switch.

With reference now to FIG. 4, in the substrate 30 there are two further n-wells 50 and 51 each of which has, at its bottom, a strongly-doped, buried n-type region 52 or 53, respectively. Two deep contact regions 54 and 55, which are also strongly doped n-type regions, extend from the surface of the substrate as far as the buried regions 52 and 53, respectively. In the n-well 50 there are three strongly-doped p-type regions 56, 57 and 58 which provide the source and drain regions of two p-channel transistors (the region 57 is the source region of one transistor and the drain region of the other). On top of each of the channels which separate the source and drain regions 57, 56 and 57, 58, there is a strip of electrically-conductive material (doped polysilicon or metal) 60, 61, separated from the surface of the substrate by a layer of dielectric material, for example, silicon dioxide. The strip 60 provides the gate electrode of a p-channel transistor which is indicated M21 in the drawings. The strip 61 provides the gate electrode of a second p-channel transistor which is indicated M4 in the drawings.

In the n-well 51 there are two strongly doped p-type regions 64 and 65 which provide the source and drain regions of a p-channel transistor. On top of the channel which separates the source and drain regions 64, 65, there is a strip of electrically-conductive material (doped polysilicon or metal) 66 separated from the substrate by a layer of dielectric material, for example, silicon dioxide. The strip 66 provides the gate electrode of a p-channel transistor which is indicated M22 in the drawings.

Metal electrodes for the connection and biasing of the various regions are formed on the front surface of the substrate on the regions 54, 56, 57, 58, 64, 65 and 55. An electrode is also provided on the bottom surface for biasing the substrate 30. In particular, the source region 56 of the transistor M21 is connected to the input terminal IN of the electronic switch and the drain region 65 of the transistor M22 is connected to the output terminal OUT.

The region 57 which provides both the drain region of the transistor M21 and the source region of the transistor M4 is connected to the source region 64 of the transistor M22. The regions 54, 55 and 58 are connected to the supply terminal +Vcc and the substrate 30 is connected to the supply terminal GND. The gate electrodes 60 and 66 of the two transistors M21 and M22 are connected together to a control terminal G21 of the electronic switch. The gate electrode 61 of the transistor M4 is connected to another control terminal G22 of the electronic switch.

Figure 2:
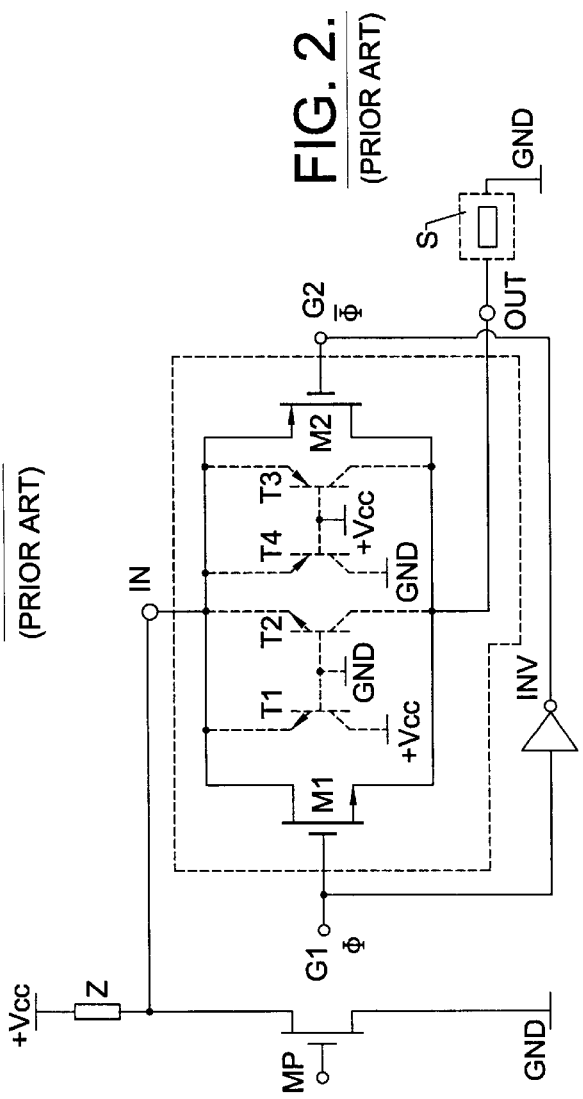
FIG. 2 is an electrical diagram of a circuit including the electronic switch of FIG. 1 as in the prior art.

In the structure of the electronic switch according to the invention there are also parasitic components, more precisely, two npn transistors similar to the transistors T1 and T2 of the known electronic switch of FIGS. 1 and 2, and, hence, indicated by the same reference symbols. The npn transistor indicated T5 is associated with the n-channel MOS transistor M12. The npn transistor, indicated T6, is formed by the regions 44, 35 and 31. Two pnp transistors indicated T7 and T8, are associated with the p-channel MOS transistors M21 and M22, respectively. A pnp transistor, indicated T9, is formed by the regions 56 and 50 and by the substrate 30. A pnp transistor, indicated T10, is formed by the regions 64 and 51 and by the substrate 30.

Figure 5:
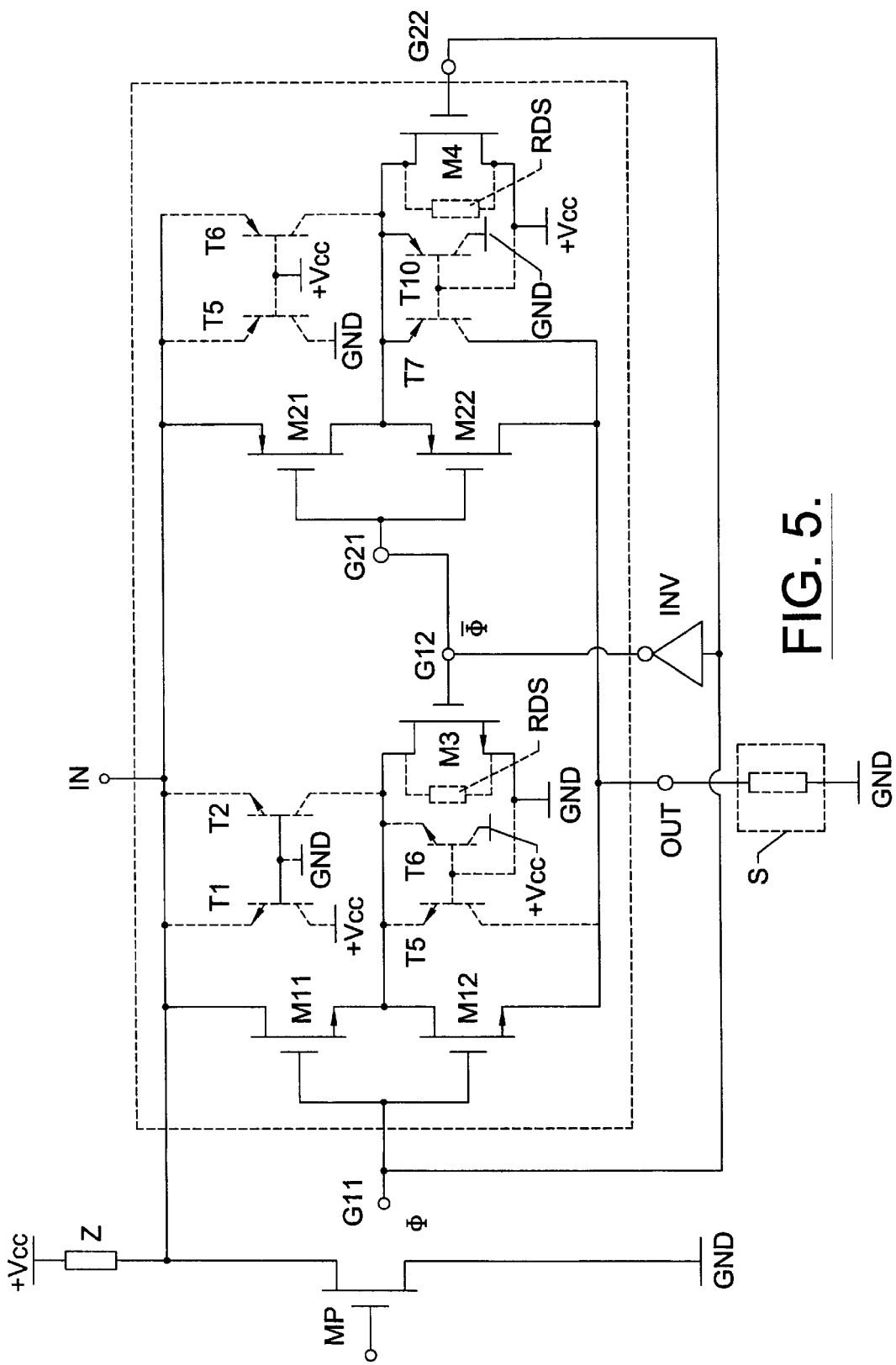
FIG. 5 is an electrical diagram of a circuit which includes the electronic switch according to the invention.

As can be seen, the circuit diagram of FIG. 5, also shows a MOS power transistor MP with its source-drain path in series with a load Z between the terminals of a voltage supply, again indicated GND and +Vcc. An electronic switch, such as that of FIGS. 3 and 4 is connected between the point at which the load Z is connected to the drain of the power transistor MP and a circuit S, for example, a sampling circuit, generally indicated by its internal impedance towards ground. The control terminals G1 and G21 are connected, respectively, to the input and to the output of an inverter INV, so that a control signal Φ applied to the terminal G11 is present, inverted, as negated $\bar{\Phi}$, at the terminal G21. In this embodiment also, the control terminals G12 and G22 are connected to the output and to the input of the inverter INV, respectively.

In operation, a "high" logic signal at the terminals G11 and G22 makes the n-channel transistors M11 and M12 conductive, cuts off the p-channel transistor M4, and produces a "low" logic signal at the control terminals G21 and G12 so that the p-channel transistors M21 and M22 become conductive and the n-channel transistor M3 is cut off. A voltage present at the terminal IN is thus also present at the terminal OUT since the transistors M11, M12, on the one hand, and, M21, M22, on the other hand, connect the terminal IN to the terminal OUT. The transistors M3 and M4 do not interfere with this connection since they are cut off.

If the voltage at the input IN varies within the limits determined by the supply voltage, the parasitic transistors are cut off. However, if Z is an inductive load, the voltage at the input IN may go beyond the supply-voltage levels, that is, below the ground GND, or above the positive voltage +Vcc, when the switch is in the open state.

A situation will be considered, in which the voltage IN goes below the ground level, that is, becomes negative, by an amount greater than the threshold voltage (Vbe) of the transistors T1 and T2 when the electronic switch is open (M11 and M12 cut off, M3 conducting). The transistors T1 and T2 become conductive, but, in contrast with the known electronic switch, do not cause leakage of the electronic switch because the collector of the transistor T2 is connected to the ground terminal GND via the resistance RDS between the drain and the source of the transistor M3 which is conducting. The transistor M3 should, however, be designed in a manner such that its resistance RDS is sufficiently small to prevent the parasitic currents which may pass through the transistor T2 from causing a voltage drop greater than the conduction threshold of the parasitic transistor T5 associated with the MOS transistor M12. In these conditions, the parasitic transistor T6 would also become conductive without, however, affecting the insulation of the electronic switch.

A wholly analogous situation arises in the p-channel branch of the electronic switch when the switch is in the open condition and there is a positive overvoltage at the input terminal IN. Given the symmetry of the two branches it is not necessary also to describe this operative situation in detail.

It is clear from the foregoing that the object of the invention is fully achieved by the electronic switch structure described with reference to FIGS. 3–5. It is intended that, in circuit applications in which the input voltage never goes beyond either of the supply-voltage limits, an electronic switch having one of its connection branches formed according to the prior art, for example, as described with reference to FIGS. 1 and 2, and the other branch formed according to the invention, for example, as described with reference to FIGS. 3 or 4, may be used.

Moreover, if the switching frequency is such that transient phenomena may occur in the electronic switch and may interfere with the insulation of the switch in the open condition, it may be appropriate to apply to the control terminals G12 and G22 control signals distinct from those applied to the control terminals G11 and G21 and suitably out of phase therewith.

Finally, it should be noted that the MOS transistors M3 and M4 could also be formed in wells separate from those which contain the MOS transistors M11 and M21, although this would require a larger area of the integrated circuit.

What is claimed is:

1. An electronic switch comprising:
    a semiconductor substrate comprising first and second wells of a first conductivity type insulated from one another;
    a first terminal, a second terminal, a third terminal, a first control terminal, and a second control terminal; and
    a first MOS transistor, a second MOS transistor, and a third MOS transistor, all of a first type;
    the first MOS transistor being formed in the first well and the second MOS transistor being formed in the second well;
    the first MOS transistor and the second MOS transistor having respective source-drain paths being connected in series between the first terminal and the second terminal and defining a first connection node, and having respective gates connected together and to the first control terminal;
    the third MOS transistor having a source-drain path connected between the first connection node and the third terminal, and having a gate connected to the second control terminal.

2. An electronic switch according to claim 1, wherein the third MOS transistor is formed in the first well.

3. An electronic switch according to claim 1, wherein said substrate further comprises a third well of the first conductivity type insulated from the first and second wells; and wherein the third MOS transistor is formed in the third well.

4. An electronic switch according to claim 1, wherein said substrate further comprises fourth and fifth wells of a second conductivity type insulated from one another; and further comprising:
 a fourth terminal; and
 a fourth MOS transistor, a fifth MOS transistor, and a sixth MOS transistor, all of a second type;
 the fourth MOS transistor being formed in the fourth well and the fifth MOS transistor being formed in the fifth well;
 the fourth MOS transistor and the fifth MOS transistor having respective source-drain paths being connected in series between the first terminal and the second terminal and defining a second connection node, and having respective gates connected together and to the second control terminal;
 the sixth MOS transistor having a source-drain path connected between the second connection node and the fourth terminal, and having a gate connected to the first control terminal.

5. An electronic switch according to claim 4, wherein the sixth MOS transistor is formed in the fourth well.

6. An electronic switch according to claim 4, wherein said substrate further comprises a sixth well of the second conductivity type insulated from the fourth and fifth wells; and wherein the sixth MOS transistor is formed in sixth well.

7. An electronic switch according to claim 4, wherein the MOS transistors of the first type are n-channel MOS transistors, and the MOS transistors of the second type are p-channel MOS transistors.

8. An electronic switch according to claim 1, further comprising an inverter connected between the first and second control terminals.

9. An electronic switch comprising:
 a semiconductor substrate comprising first and second wells of a first conductivity type insulated from one another, and fourth and fifth wells of a second conductivity type insulated from one another;
 a first terminal, a second terminal, a third terminal, a fourth terminal, a first control terminal, and a second control terminal; and
 a first MOS transistor, a second MOS transistor, and a third MOS transistor, all of a first type;
 the first MOS transistor being formed in the first well and the second MOS transistor being formed in the second well;
 the first MOS transistor and the second MOS transistor having respective source-drain paths being connected in series between the first terminal and the second terminal and defining a first connection node, and having respective gates connected together and to the first control terminal;
 the third MOS transistor having a source-drain path connected between the first connection node and the third terminal, and having a gate connected to the second control terminal; and
 a fourth MOS transistor, a fifth MOS transistor, and a sixth MOS transistor, all of a second type;
 the fourth MOS transistor being formed in the fourth well and the fifth MOS transistor being formed in the fifth well;
 the fourth MOS transistor and the fifth MOS transistor having respective source-drain paths being connected in series between the first terminal and the second terminal and defining a second connection node, and having respective gates connected together and to the second control terminal;
 the sixth MOS transistor having a source-drain path connected between the second connection node and the fourth terminal, and having a gate connected to the first control terminal.

10. An electronic switch according to claim 9, wherein the third MOS transistor is formed in the first well.

11. An electronic switch according to claim 9, wherein said substrate further comprises a third well of the first conductivity type insulated from the first and second wells; and wherein the third MOS transistor is formed in the third well.

12. An electronic switch according to claim 9, wherein the sixth MOS transistor is formed in the fourth well.

13. An electronic switch according to claim 9, wherein said substrate further comprises a sixth well of the second conductivity type insulated from the fourth and fifth wells; and wherein the sixth MOS transistor is formed in sixth well.

14. An electronic switch according to claim 9, wherein the MOS transistors of the first type are n-channel MOS transistors and the MOS transistors of the second type are p-channel MOS transistors.

15. An electronic switch according to claim 9, further comprising an inverter connected between the first and second control terminals.

16. An electronic circuit comprising:
 a power MOS transistor;
 an electronic switch connected to said power MOS transistor and comprising
  a semiconductor substrate comprising first and second wells of a first conductivity type insulated from one another;
  a first terminal, a second terminal, a third terminal, a first control terminal, and a second control terminal; and
  a first MOS transistor, a second MOS transistor, and a third MOS transistor, all of a first type;
  the first MOS transistor being formed in the first well and the second MOS transistor being formed in the second well;
  the first MOS transistor and the second MOS transistor having respective source-drain paths being connected in series between the first terminal and the second terminal and defining a first connection node, and having respective gates connected together and to the first control terminal;
  the third MOS transistor having a source-drain path connected between the first connection node and the third terminal, and having a gate connected to the second control terminal.

17. An electronic circuit according to claim 16, wherein the third MOS transistor is formed in the first well.

18. An electronic circuit according to claim 16, wherein said substrate further comprises a third well of the first conductivity type insulated from the first and second wells; and wherein the third MOS transistor is formed in the third well.

19. An electronic circuit according to claim 16, wherein said substrate further comprises fourth and fifth wells of a second conductivity type insulated from one another; and further comprising:

a fourth terminal; and a fourth MOS transistor, a fifth MOS transistor, and a sixth MOS transistor, all of a second type;

the fourth MOS transistor being formed in the fourth well and the fifth MOS transistor being formed in the fifth well;

the fourth MOS transistor and the fifth MOS transistor having respective source-drain paths being connected in series between the first terminal and the second terminal and defining a second connection node, the fourth MOS transistor and the fifth MOS transistor having respective gates connected together and to the second control terminal;

the sixth MOS transistor having a source-drain path connected between the second connection node and the fourth terminal, and having a gate connected to the first control terminal.

20. An electronic circuit according to claim 19, wherein the sixth MOS transistor is formed in the fourth well.

21. An electronic circuit according to claim 19, wherein said substrate further comprises a sixth well of the second conductivity type insulated from the fourth and fifth wells; and wherein the sixth MOS transistor is formed in sixth well.

22. An electronic circuit according to claim 19, wherein the MOS transistors of the first type are n-channel MOS transistors and the MOS transistors of the second type are p-channel MOS transistors.

23. An electronic circuit according to claim 16, further comprising an inverter connected between the first and second control terminals.

* * * * *